United States Patent
Ferrara et al.

(10) Patent No.: US 9,368,958 B2
(45) Date of Patent: Jun. 14, 2016

(54) SENSOR CONTROLLED TRANSISTOR PROTECTION

(71) Applicant: NXP B.V., Eindhoven (NL)

(72) Inventors: Alessandro Ferrara, Eindhoven (NL); Luc van Dijk, Kranenburg (DE); Peter Gerard Steeneken, Valkenswaard (NL)

(73) Assignee: NXP B.V., Eindhoven (NL)

( * ) Notice: Subject to any disclaimer, the term of this patent is extended or adjusted under 35 U.S.C. 154(b) by 408 days.

(21) Appl. No.: 14/045,611

(22) Filed: Oct. 3, 2013

(65) Prior Publication Data

US 2015/0098163 A1 Apr. 9, 2015

(51) Int. Cl.
| | |
|---|---|
| H02H 5/00 | (2006.01) |
| H02H 5/04 | (2006.01) |
| H03K 17/082 | (2006.01) |
| H03K 17/14 | (2006.01) |
| H03K 5/08 | (2006.01) |
| H03K 17/08 | (2006.01) |

(52) U.S. Cl.
CPC .............. *H02H 5/044* (2013.01); *H02H 5/04* (2013.01); *H03K 5/08* (2013.01); *H03K 17/0822* (2013.01); *H03K 17/145* (2013.01); *H03K 2017/0806* (2013.01)

(58) Field of Classification Search
CPC ....................................................... H02H 5/044
USPC .......................................................... 361/113
See application file for complete search history.

(56) References Cited

U.S. PATENT DOCUMENTS

| | | | |
|---|---|---|---|
| 6,917,234 | B2 | 7/2005 | Horn et al. |
| 7,528,645 | B2 * | 5/2009 | Scheikl .............. H03K 17/0822 327/312 |
| 2004/0075103 | A1 | 4/2004 | Topp et al. |
| 2006/0214704 | A1 | 9/2006 | Nakano |
| 2007/0070567 | A1 | 3/2007 | Bayerer et al. |
| 2012/0049932 | A1 | 3/2012 | Hokabira et al. |
| 2012/0242376 | A1 | 9/2012 | Ose et al. |

FOREIGN PATENT DOCUMENTS

| | | |
|---|---|---|
| EP | 2 434 517 A1 | 3/2012 |
| EP | 2 437 385 A2 | 4/2012 |

OTHER PUBLICATIONS

Extended European Search Report for European Patent Appln. No. 14183184.2 (Jan. 27, 2015).

* cited by examiner

*Primary Examiner* — Stephen W Jackson
(74) *Attorney, Agent, or Firm* — Rajeev Madnawat

(57) ABSTRACT

A circuit for protecting a transistor is disclosed. The circuit includes a temperature sensing device coupled to the transistor and a tunable clamping circuit connected between transistor terminals, wherein the tunable clamping circuit is configured to provide an adjustable clamping voltage. A temperature controller coupled to the temperature sensing device and the tunable clamping circuit is also included. The temperature controller is configured to trigger a change in a clamping voltage of the tunable clamping circuit based on a feedback from the temperature sensing device.

18 Claims, 7 Drawing Sheets

US 9,368,958 B2

SENSOR CONTROLLED TRANSISTOR PROTECTION

BACKGROUND

When a voltage source is connected to an inductor and a switch and if the switch has been closed for a period of time, a positive potential on the voltage source drives a current through the inductor, such that it becomes fully or substantially fully energized. A second terminal of a voltage source is coupled to a first terminal of the inductor and a first terminal of the switch is coupled to a second terminal of the inductor. A second terminal of the switch and a first terminal of the voltage source are connected to ground.

When the switch is opened, the fully or substantially fully energized inductor attempts to resist a sudden drop in current by using its magnetic field energy to create its own voltage and supply current, through the switch. As a result, an extremely large increase in the positive potential is created at the second terminal of the inductor. The switch, being connected between the second terminal of the inductor and ground, has to withstand this high potential difference. Since no connection is physically made to allow current to continue to flow (due to the switch being open), this large potential difference can cause electrons to "arc" between the terminals of of the open switch. This behavior can cause rise in temperature inside the switch and may burn the switch. Similarly, for non-mechanical solid state switches (e.g. a transistor), large voltage drops across the terminals of an open solid state switch can destroy the component in question either instantaneously or through accelerated wear and tear.

SUMMARY

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

In one embodiment, a circuit for protecting a transistor is disclosed. The circuit includes a temperature sensing device coupled to the transistor and a tunable clamping circuit connected between transistor terminals, wherein the tunable clamping circuit is configured to provide an adjustable clamping voltage. A temperature controller coupled to the temperature sensing device and the tunable clamping circuit is also included. The temperature controller is configured to trigger a change in a clamping voltage of the tunable clamping circuit based on a feedback from the temperature sensing device.

In another embodiment, a tunable voltage clamping circuit is disclosed. The tunable voltage clamping circuit includes a plurality of voltage clamping devices connected in series. A plurality of driver switches coupled to the plurality of voltage clamping devices are also included. At least some of the plurality of voltage clamping devices are connected to a source and a drain of one of the driver switches.

In yet another embodiment, a method of protecting a transistor is disclosed. The method includes continuously monitoring a temperature of the transistor. The temperature is converted into a first voltage and the first voltage is compared with a reference voltage. A Zener protection of the transistor is activated when the first voltage exceeds the reference voltage.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments. Advantages of the subject matter claimed will become apparent to those skilled in the art upon reading this description in conjunction with the accompanying drawings, in which like reference numerals have been used to designate like elements, and in which:

DETAILED DESCRIPTION

Figure 1:
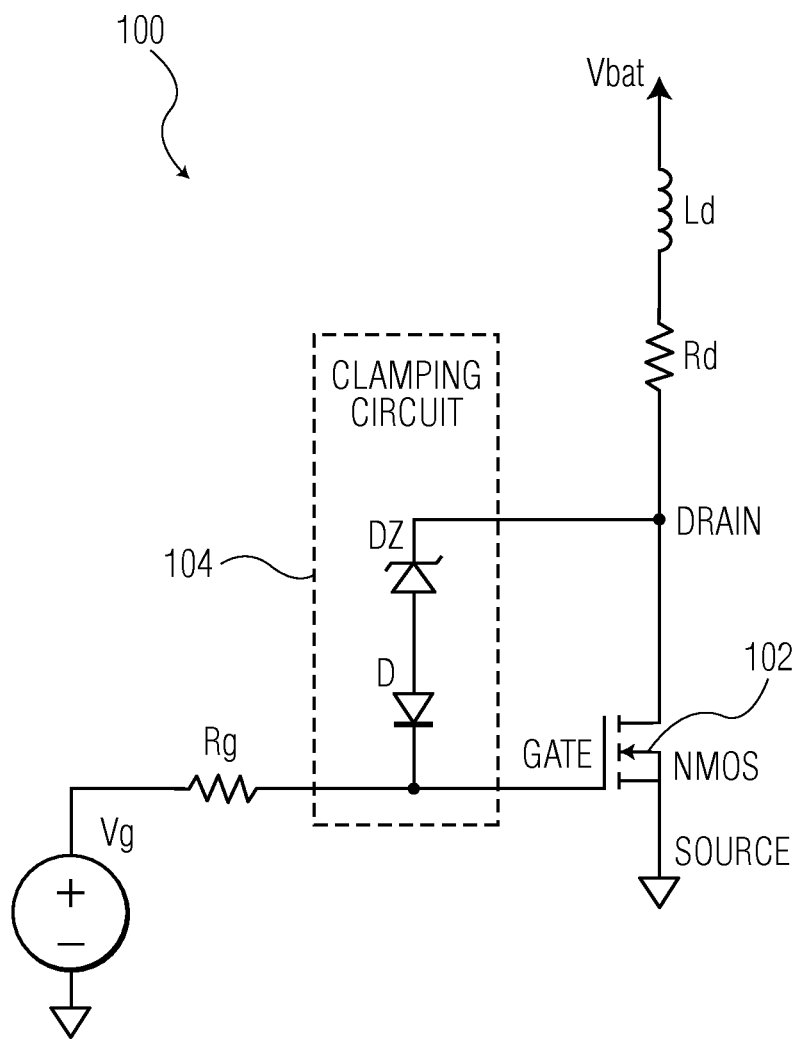
FIG. 1 is an exemplary circuit diagram including a clamping circuit.

FIG. 1 shows a protection circuit used in clamped inductive switching (CIS). An electrical feedback circuit (Zener clamp protection) is used to protect the transistor (i.e., the switch) from voltage overshoots when switching an inductive load. The Zener clamp protection 104 circuit uses a Zener diode Dz. The Zener diode Dz is a diode which allows current to flow in the forward direction in the same manner as an ideal diode, but also permits it to flow in the reverse direction when the voltage is above a certain value known as the breakdown voltage, clamping voltage or the zener voltage. Standard clamped inductive switching circuits operate with the Zener clamp protection 104. For simplicity the rest of the discussion considers that the transistor is an NMOS transistor, but of course similar protection can be implemented for other types of transistors by a person skilled in the art. If $V_g$ is set to a high voltage for a substantial time a DC current runs through transistor and inductor, driven by a battery that generates a voltage $V_{bat}$. Then if $V_g$ is switched off (0 V), the transistor will try to block the current, but the inductor will resist changes in current by generating a voltage $V_L = L_d \cdot dI_d/dt$ between its second and first terminals ($V_L = V_{second} - V_{first}$). In order to protect the transistor from failure due to this high voltage, a Zener diode DZ is put between drain and gate of the transistor. If the voltage at the drain raises above the trigger voltage of the Zener VZ, this increase in voltage will cause a current $I_Z$ through the Zener and the resistor $R_g$ (in FIG. 1) that will raise the gate voltage of the transistor by an amount $I_Z R_g$ and turns the transistor on. Due to the resulting drop in resistance of the transistor, the drain voltage will drop until it is at or below $V_Z$. The resistor $R_g \sim 1$ kOhm has a large value in order to be able to generate a substantial voltage at a small $I_Z$. It should however not be too large, since in that case it can limit the transistor switching time by increasing the associated RC time constant ($R_g$ C). In practice this feedback mechanism is so fast that the drain voltage of the transistor will never rise substantially above $V_{g,on} + V_Z + V_{Df}$. Where $V_{g,on}$ is the gate voltage required to turn on the transistor and $V_{Df}$ is the forward voltage of the normal diode that is back-to-back connected with the Zener diode and serves to prevent current flow from gate to drain when $V_g$ is high.

When a voltage spike occurs (i.e., when the transistor is switched off), the drain voltage is clamped by the Zener at a fixed voltage $V_Z$, while coil $L_d$ discharges itself on the transistor with a time-dependent, current $I_d$ which has an approximately constant negative time derivative $dI_d/dt = -V_Z/L_d$. The current will reduce at a rate roughly given by $dI_d/dt = -V_Z/L_d$. Therefore a large value of the Zener voltage $V_Z$ is desirable to result in a rapid current reduction and an associated short switching/clamping time. This is especially important in cases where the inductor is as the actuator in an electromechanical relay, since faster switch-off of the relay will lead to longer lifetime. Also in case the inductor is used to drive valves (e.g. in hydraulic systems), fast switching is desired for fast actuation of the valves.

For the circuit in FIG. 1, the switching time can analytically be expressed as:

$$T_{switch} = -(L_d/R_d)\log((V_z - V_{bat})/V_z) \approx (L_d V_{bat}/R_d V_z)$$

Where in one example, the approximate limit at $Vc \gg V_{bat}$ is considered.

This larger value of Vz results in a larger dissipated power ($P_d = V_Z * I_d$) during clamping that typically heats up the transistor 102 and may lead to thermal failure if the temperature becomes too high. In practical applications the ambient temperature $T_{amb}$ of the transistor is not known and can vary over a large range from room temperature (e.g., ~25 C) up to values of approximately 175 C in automotive applications. The clamping pulse causes the temperature to increase further to a value $T_{max} = T_{amb} + \Delta T$. Where roughly $\Delta T = R_{th} * P_d$ and $R_{th}$ is the thermal resistance of the transistor 102. In order not to break down due to overheating at a temperature $T_{crit}$, the area of the transistor 102 needs to be increased, such that its thermal resistance reduces sufficiently to guarantee that $T_{max} < T_{crit}$. This over dimensioning increases overall device area and cost.

Figure 2A:
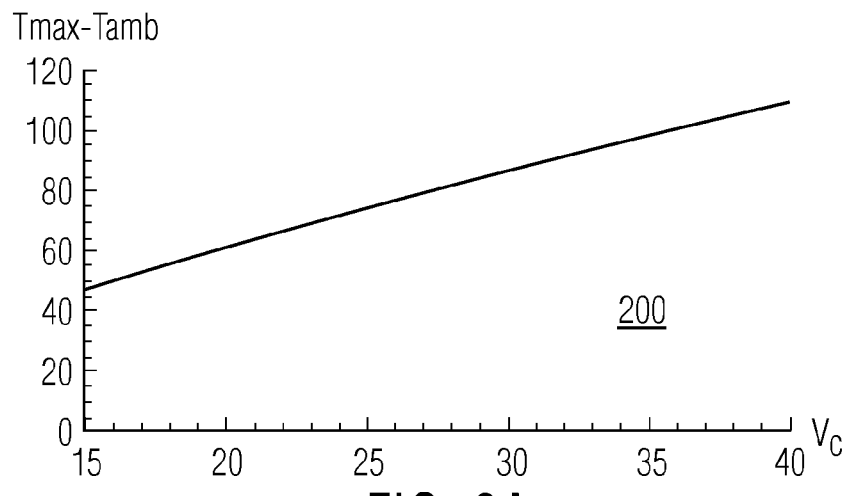
FIGS. 2A-2C illustrate exemplary graphs showing a relationship between the 2A: clamping voltage and the maximum temperature change reached by the transistor during switching off; 2B: clamping voltage and total energy dissipation in the transistor during switching off; 2C: clamping voltage and time needed to reduce the current through the inductor to zero.
Figure 2B:
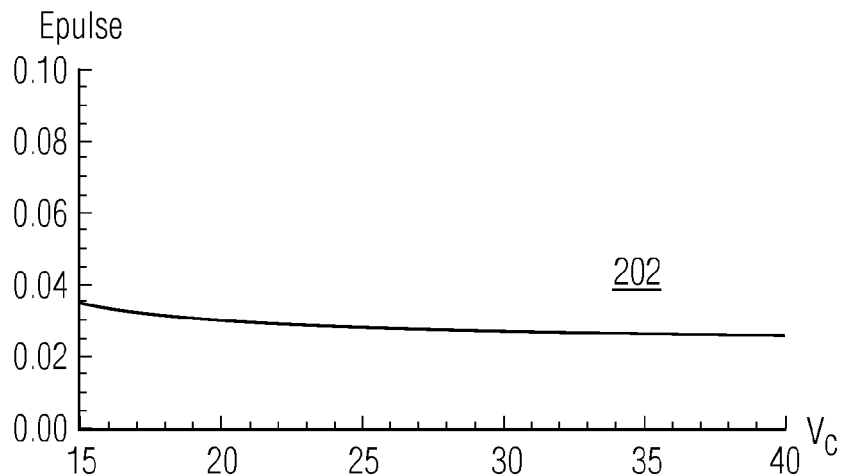
Figure 2C:
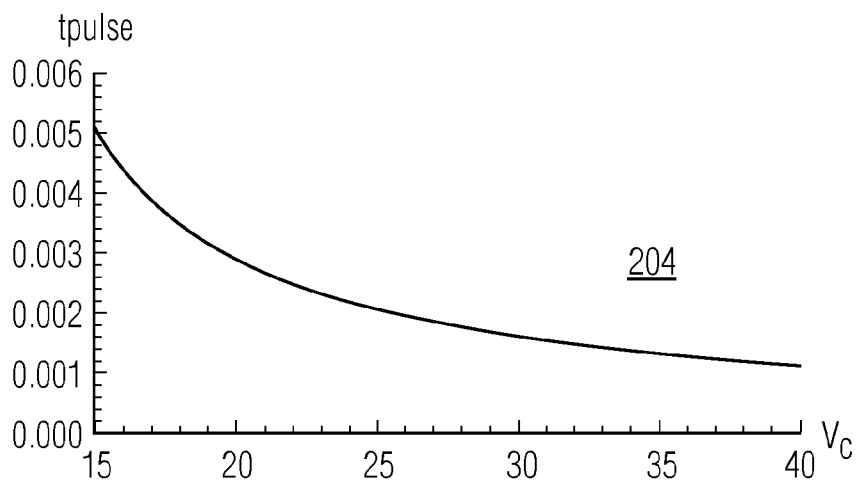

FIGS. 2A-2C exemplarily show that reduction of the Zener clamping voltage can significantly reduce the temperature rise (FIG. 2A) at the cost of increasing the pulse time (FIG. 2C). The graph 200 shows maximum temperature $T_{max} - T_{amb}$ on the y-axis, versus the clamping voltage Vc-Vz on the x-axis. The graph 202 depicted in FIG. 2 shows that the pulse energy absorbed by the transistor is almost independent of clamping voltage Vc. The graph 204 depicted in FIG. 2C shows that pulse/switching time reduces quickly with increasing clamping voltage. In this example, simulation parameters are $L_d = 32$ mH, $R_d = 10$ Ohm, $R_{th} = 3$ K/W, $C_{th} = 33.3$ uJ/K, $V_{bat} = 12$ V. Reducing Vc from 40 to 20V leads to a temperature increase of ~50% less.

Another exemplary method of protecting the switch is to use a flyback diode in parallel to the inductor ($L_d$). The flyback diode will create a local feedback loop to dissipate electrical energy suddenly produced by the inductor is not fed into the switch. The said use of a flyback diode, however, does not provide a fast turn off and hence is not fully suitable for applications that require fast turn offs (e.g., relay and valve drivers).

Figure 3:
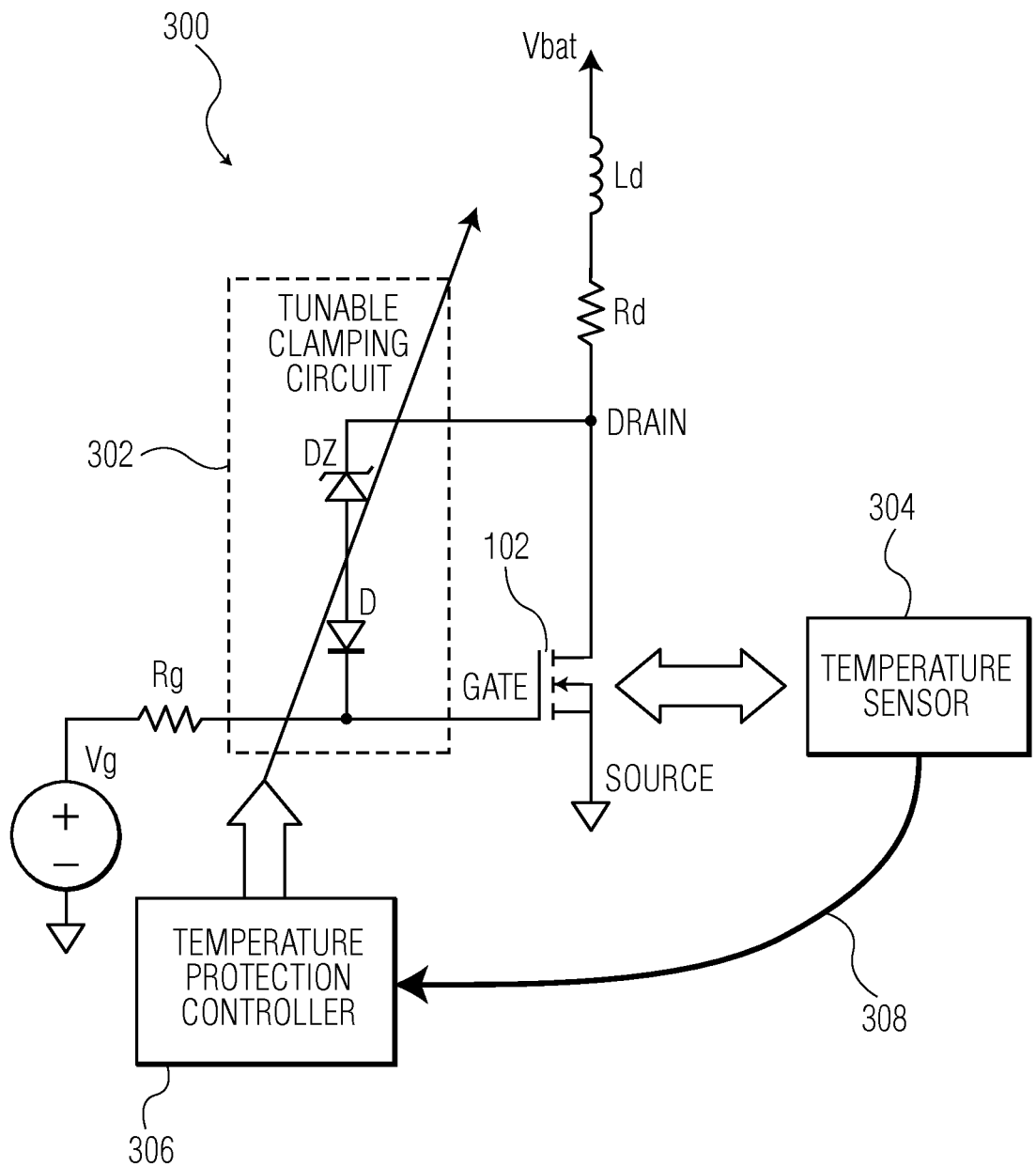
FIG. 3 illustrates a temperature feedback circuit and a tunable clamping circuit in accordance with one embodiment of the present disclosure.

FIG. 3 illustrates a CIS configuration 300 that includes a temperature protection controller 306 and a transistor temperature feedback circuit 308 that is coupled to a temperature sensor 304 that in turn is coupled to the transistor 102. The transistor protection controller 306 is coupled to a tunable clamping circuit 302. The tunable clamping circuit 302 is configured to provide variable clamping voltage based on the feedback from the temperature sensor 304. In one embodiment, the tunable clamping circuit 302 includes a plurality of Zener diodes. In one example, all but one of these Zener diodes are configured in such a way that they can be bypassed, typically through one or more switches. For example, if a Zener is connected to the drain and source of a transistor, closing the transistor through an application of voltage at the gate will bypass the Zener.

Note that a Zener diode is being used in these examples for an easy understanding of the description. In practice, other voltage clamping devices, e.g., grounded-gate-MOSFETs, tunnel FETs, spark gaps, avalanche diodes or active voltage clamp circuits may be used instead of Zener diodes.

In one embodiment, the tunable Zener circuit includes a minimum number of external electrical terminals equal to a number of plurality of switches plus two. At least one of the plurality of Zener diodes is not connected to both a drain and a source of any of the plurality of switches. Each of the plurality of switches is defined to be independently operated from an external source. The plurality of switches are configured such that when a switch closes, all switches located at the lower side of the switch in a series of switches including the plurality of switches are also closed.

The clamping voltage can be modified as the temperature changes in order to protect the transistor 102. For example, if the temperature sensor 304 reads a temperature value close to the maximum operating temperature of the transistor 102, the temperature protection controller will cause the tunable clamping circuit 302 to reduce the clamping voltage in order to reduce the power dissipation, thus lowering the temperature of the transistor 102. Alternatively, the temperature protection controller can estimate the maximum temperature reached by the transistor using a temperature prediction algorithm. Based on the measured time derivative of the temperature sensed by 304, the maximum temperature will be calculated by the prediction algorithm. If the calculated maximum temperature exceeds the maximum tolerable temperature $T_{crit}$ the clamping voltage will be reduced until the predicted temperature is below $T_{crit}$. The controller could employ a PID (proportional-integral-derivative) controller feedback algorithm for temperature prediction and regulation. A sigma-delta ADC converter may also be used for controlling the chain of Zener diodes.

Figure 4:
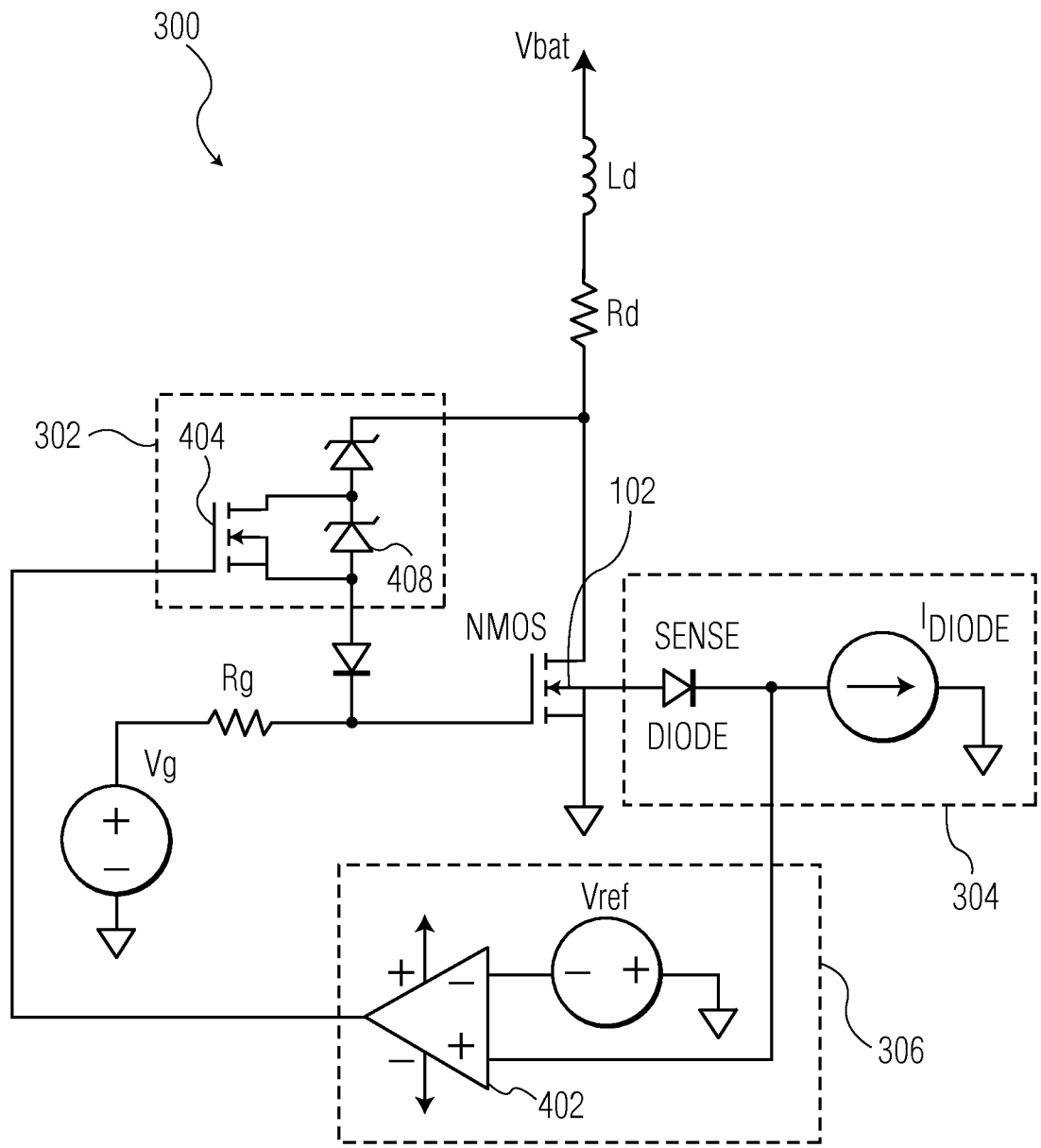
FIG. 4 illustrates a circuit for protecting a transistor, in accordance with one embodiment of the present disclosure.

FIG. 4 depicts an exemplary structure of the circuit 300 in accordance with one embodiment. A person skilled in the art would appreciate that the structural details shown in FIG. 4 are mere exemplary and may be replaced with equivalent structures using different circuit components, without deviating from the scope of the present disclosure. In this example, the temperature sensor 304 includes a sense-diode. The temperature sensor 304 (or the temperature sensing device) may include a circuit for converting a temperature into a voltage. In one embodiment the sense-diode is integrated in the transistor design. That is, the sense diode is not a discrete or separate component but is fabricated in a same semiconductor wafer (or substrate) along with the transistor 102. In another embodiment, at least some components shown in the circuit 300 are discrete components while the remaining components are fabricated together on a same wafer. In another embodiment, all active components (e.g., transistor, diode, Zener, etc.) except the inductor $L_d$ are fabricated on a same wafer as a part of one semiconductor fabrication process (e.g., components are not added to the circuit after some components were fabricated on a wafer). In yet another embodiment, only the components that are directly coupled to the transistor 102 are fabricated together on a same wafer. The substrate can be a silicon or silicon-on-insulator substrate.

In one embodiment, when the circuit 300 is connected to a live power source (e.g., $V_{bat}$), the sense-diode is biased at a pre-selected fixed or a pre-selected constant current $I_{diode}$. The voltage drop across the sense-diode is proportional to the temperature of the transistor 102. In one example, the sense-diode voltage (and corresponding temperature) is compared with a reference voltage $V_{ref}$ to determine the output of a comparator 402 that is a part of the temperature protection controller 306. In one embodiment, the comparator 402 is compares two input voltages. If the comparator 402 output is high (e.g., when the sensed transistor temperature is higher than the critical temperature $T_{crit}$, the sense-diode produces voltage greater than the reference voltage $V_{ref}$), a driver switch 404 will shunt the lower Zener diode 408 and reduce the overall clamping voltage. This reduction in the overall clamping voltage will reduce the dissipated power and the temperature in the transistor 102 until the latter becomes lower than the critical temperature ($T_{crit}$). At that point, the output of the comparator 402 becomes negative, so that the driver switch 404 is turned off and the lower Zener 408 is no longer bypassed, thus restoring the clamping voltage provided by the tunable clamping circuit 302 to the original pre-set value. The critical temperature ($T_{crit}$) is the temperature of the transistor 102 above which the protection is activated. In one example, the critical temperature $T_{crit}$ may be configurable. For example, $T_{crit}$ may be set to a selected value or varied by varying the reference voltage $V_{ref}$. In any case $T_{crit}$ should be less than $T_{breakdown}$, the temperature at which the transistor breaks.

In one embodiment, one or more Zener diodes are used for providing the Zener voltage. In other embodiments, instead of the Zener diode(s), other voltage clamping devices or circuits such as grounded-gate-MOSFETs, tunnel FETs, spark gaps, avalanche diodes or active voltage clamp circuits.

In the embodiment in which Zener diodes are used, in one example, the tunable clamping circuit 302 comprises an array of Zener diodes, each of the diodes in the array of Zener diodes may have a different Zener voltage and all but one of the Zener diodes having a Zener voltage that is twice the Zener voltage of another diode in the array. In another embodiment, all Zener diodes in the array have the same Zener voltage. In yet another embodiment, the Zener voltage of each of the Zener diodes in the array may be different.

Figure 5:
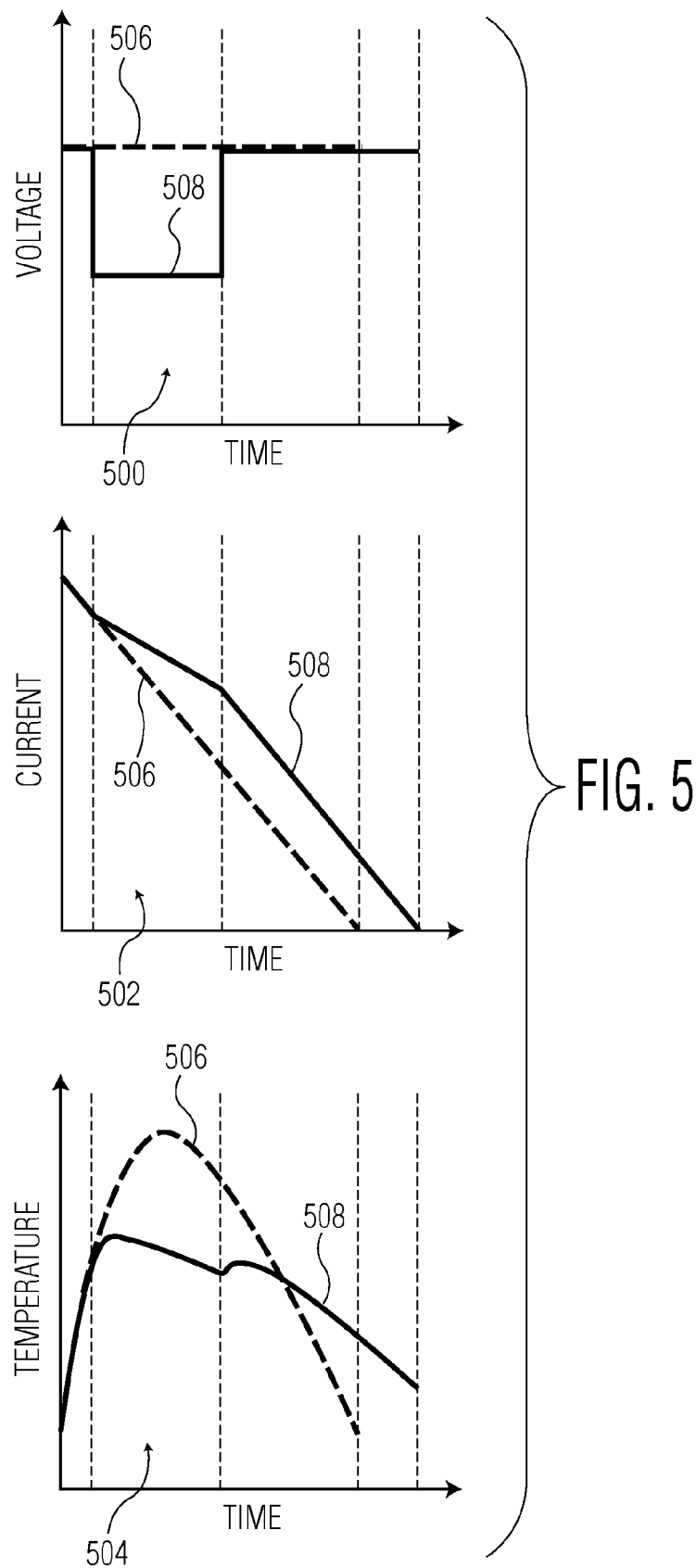
FIG. 5 illustrates exemplary graphs showing comparison between voltage, current and temperature; Dashed lines (506) correspond to the case without protection, solid lines (508) show the case with protection.

FIG. 5 depicts graphs 500, 502, 504 that illustrate comparisons between voltage, current and temperature waveforms in the standard CIS configuration without the protection circuit (506) and in the protected CIS configuration with the embodiments of the circuit 300 described in one or more embodiments herein (508). The protection systems and methods described herein allow preventing temperature peaks leading to device failures at the cost of a longer clamping (switch-off) time.

The typical waveforms in the protected CIS configuration are shown in FIG. 5 as solid lines 508, and compared to those in a standard CIS configuration in dashed lines 506 (as illustrated in FIG. 1). The protected configuration as exemplarily illustrated in the circuit 300 guarantees temperature protection at the expense of a longer clamping time. The longer clamping time only occurs at high ambient temperatures (e.g. close to 175 C for automotive applications).

Figure 6:
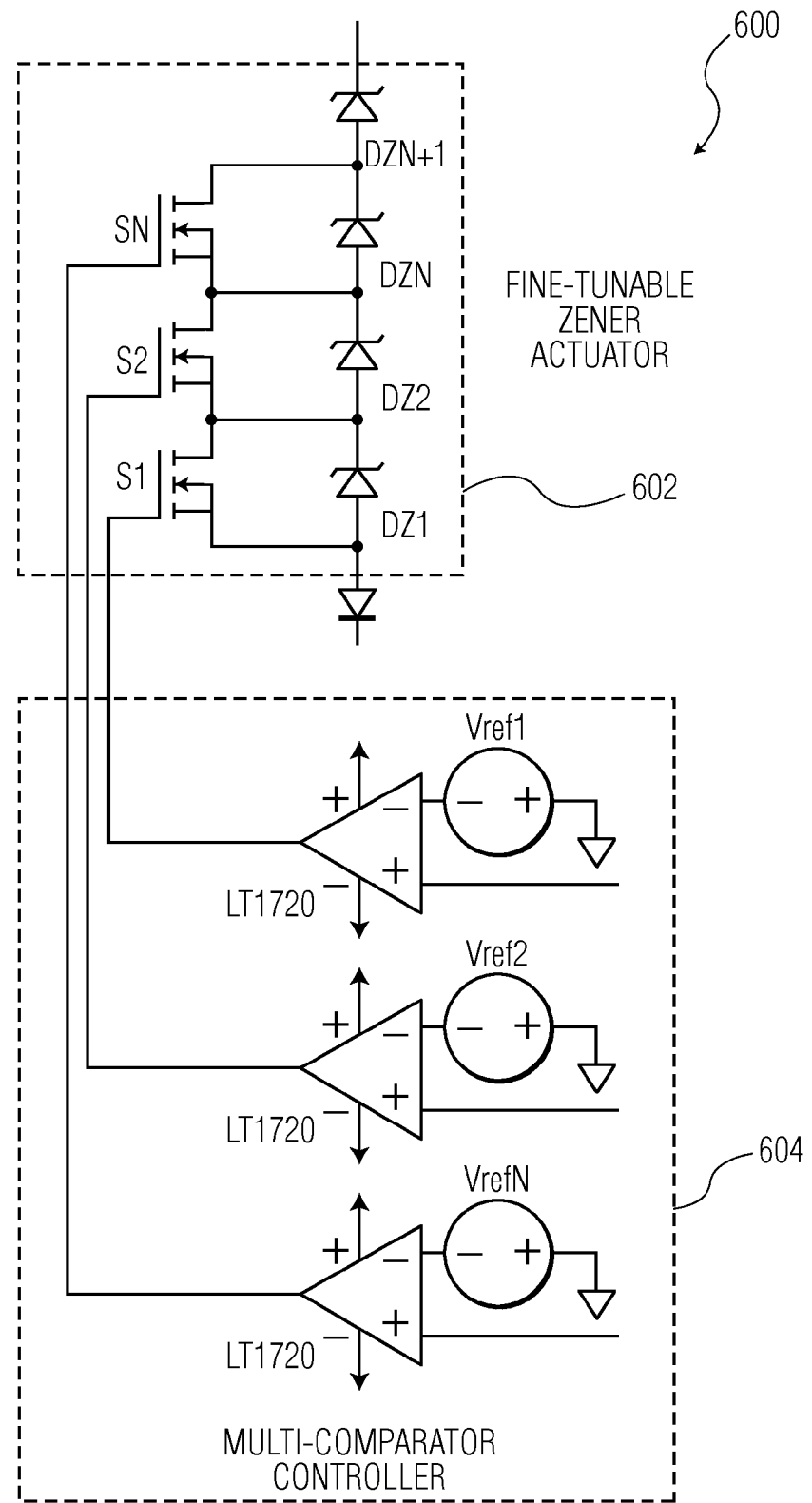
FIG. 6 illustrates a fine-tunable clamping circuit in accordance with one embodiment of the present disclosure.

FIG. 6 illustrates a fine-tunable clamping circuit 600 including a fine-tunable actuator 602 having multiple layers of Zener diodes $DZ_1$-$DZ_n$ coupled to driver switches $S_1$-$S_N$. The circuit 600 also includes multiple comparators in a multi-comparator controller 604. Each of the comparators in the multi-comparator controller 604 drives one of the switches $S_1$-$S_N$. By choosing the values $Vref_1$-$Vref_N$ in an increasing order, a fine granularity of shunting Zeners $DZ_1$-$DZ_N$ can be achieved. The number N may be selected based on a particular operating environment or application requirement.

The Zener diodes $DZ_1$-$DZ_n$ might all have the same Zener voltage $V_Z$. In order to reduce the number of required driver switches $S_1$ it is however more beneficial to create a binary array of Zener diodes $DZ_{b1}$-$DZ_{bn}$. Where $V_{Zb2}=2V_{Zb1}$ and $V_{Zbk+1}=2V_{Zbk}$. Each of the Zener elements might also be composed out of a chain of diodes. Each of the elements has however only 1 switch $S_{bn}$. The total clamping voltage (given by summing $V_{Zbk}$ for all values of k for which the driver switch $S_{bk}$ is open) can then be adjusted with a resolution equal to the smallest voltage $V_{Zb1}$. The total number of driver switches required in such a binary array reduces however by a factor $2^n/n$. In this example the controller 604 may include level shifters for driving the switches.

Figure 7:
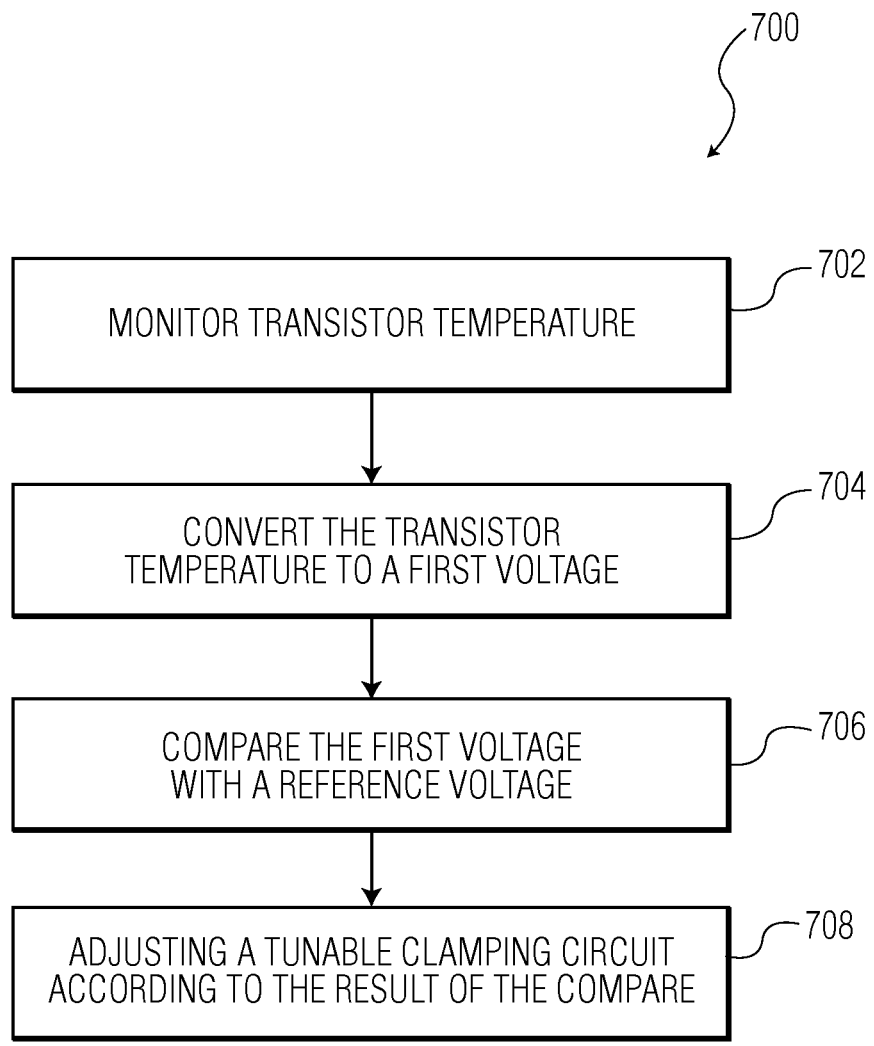
FIG. 7 illustrates a method for protecting a device against failure in accordance with one embodiment of the present disclosure.

FIG. 7 illustrates a method 700 for protecting a device against failure in accordance with one embodiment of the present disclosure. Accordingly, at step 702, a sensor is used to continuously monitor the temperature of the device. In one embodiment, the temperature sensor sensor is fabricated with the device using well known semiconductor fabrication processes. In one example, a sense diode along with other components, if needed, may be used for sensing temperature. At step 704, the device temperature is converted into a first voltage. Typically, any silicon diode can be used for temperature sensing and converting the temperature to the first voltage. However, specialized diodes are also commonly available for this purpose. In one embodiment, a sensing diode that can sense temperature with a margin of error less than or equal to 2 degree centigrade is used. A current source is used for diode excitation. The current source provides a configurable fix current biasing. In another embodiment, a constant current source with thermal compensation may also be used. At step 706, the first voltage is continuously compared with a pre-set reference voltage. The temperature independent reference voltage, e.g. a bandgap voltage reference, is selected based on maintaining the device temperature below a selected maximum temperature. At step 708, a tunable clamping circuit is adjusted according to the result of the comparison of the first voltage with the reference voltage. In one example, when the first voltage exceeds the reference voltage, the Zener protection is activated and so long as the first voltage remains below the reference voltage or goes below the reference voltage after going over the reference voltage, the Zener protection is deactivated. In one example, activating the Zener protection means disabling one or more Zener diodes in the tunable clamping circuit. Similarly, deactivating the Zener protection means enabling the previously disabled one or more Zener diodes in the tunable clamping circuit.

The use of the terms "a" and "an" and "the" and similar referents in the context of describing the subject matter (particularly in the context of the following claims) are to be construed to cover both the singular and the plural, unless otherwise indicated herein or clearly contradicted by context. Recitation of ranges of values herein are merely intended to serve as a shorthand method of referring individually to each separate value falling within the range, unless otherwise indicated herein, and each separate value is incorporated into the specification as if it were individually recited herein. Furthermore, the foregoing description is for the purpose of illustration only, and not for the purpose of limitation, as the scope of protection sought is defined by the claims as set forth hereinafter together with any equivalents thereof entitled to. The use of any and all examples, or exemplary language (e.g., "such as") provided herein, is intended merely to better illustrate the subject matter and does not pose a limitation on the scope of the subject matter unless otherwise claimed. The use of the term "based on" and other like phrases indicating a condition for bringing about a result, both in the claims and in the written description, is not intended to foreclose any other conditions that bring about that result. No language in the specification should be construed as indicating any non-claimed element as essential to the practice of the invention as claimed.

Preferred embodiments are described herein, including the best mode known to the inventor for carrying out the claimed subject matter. Of course, variations of those preferred embodiments will become apparent to those of ordinary skill in the art upon reading the foregoing description. The inventor expects skilled artisans to employ such variations as appropriate, and the inventor intends for the claimed subject matter to be practiced otherwise than as specifically described herein. Accordingly, this claimed subject matter includes all modifications and equivalents of the subject matter recited in the claims appended hereto as permitted by applicable law. Moreover, any combination of the above-described elements in all possible variations thereof is encompassed unless otherwise indicated herein or otherwise clearly contradicted by context.

What is claimed is:

1. A circuit for protecting a transistor, comprising:
    a temperature sensing device coupled to the transistor, the temperature sensing device includes a sense diode that is biased with a pre-selected constant current;
    a tunable clamping circuit connected between transistor terminals through a diode, wherein the tunable clamping circuit is configured to provide an adjustable clamping voltage; and
    a temperature controller coupled to the temperature sensing device and the tunable clamping circuit, the temperature controller is configured to trigger a change in a clamping voltage of the tunable clamping circuit based on a feedback from the temperature sensing device.

2. The circuit of claim 1, wherein the temperature controller includes a voltage comparator that is coupled to the sense diode.

3. The circuit of claim 2, wherein the voltage comparator includes a first input and a second input, the first input is connected to the output of the temperature sensing circuit and the second input is connected to a reference voltage source.

4. The circuit of claim 1, wherein the tunable clamping circuit is connected between the drain and gate terminals of the transistor.

5. The circuit of claim 1, wherein the temperature controller comprises a proportional-integral-derivative (PID) controller to maintain the transistor temperature below a selected maximum temperature.

6. The circuit of claim 1, wherein the tunable clamping circuit comprises an array of Zener diodes.

7. The circuit of claim 6, wherein the temperature controller comprises a sigma-delta converter that is used to drive the array of Zener diodes in the tunable clamping circuit.

8. The circuit of claim 1, wherein the adjustable clamping voltage is provided by one of grounded-gate-MOSFET, tunnel FET, spark gaps, avalanche diode and active voltage clamp circuits.

9. The circuit of claim 2, wherein the tunable clamping circuit includes a driver switch coupled to a Zener diode.

10. The circuit of claim 9, wherein an output of the temperature controller is coupled to a gate of the driver switch.

11. The circuit of claim 10, wherein the temperature controller is configured to output one or more voltage values at inputs of the tunable clamping circuit to open and close one or more of the driver switches.

12. The circuit of claim 11, wherein the tunable clamping circuit is configured to shunt at least one voltage clamping device when the driver switch is closed though an application of a voltage at a gate of the driver switch.

13. A tunable voltage clamping circuit, comprising:
    a plurality of voltage clamping devices connected in series;
    a plurality of driver switches coupled to the plurality of voltage clamping devices;
    at least some of the plurality of voltage clamping devices being connected to a source and a drain of one of the driver switches;
    a diode for interfacing with a transistor, wherein the plurality of switches are configured such that when a switch is closed, all switches located between the diode and the switch in a series of switches including the plurality of switches are also close.

14. The tunable voltage clamping circuit of claim 13, wherein a minimum number of external electrical terminals is equal to a number of plurality of driver switches plus two.

15. A method of protecting a transistor, comprising:
    continuously monitoring a temperature of the transistor using a sense diode coupled to the transistor, where the sense diode that is biased with a pre-selected constant current;
    converting the temperature into a first voltage;
    comparing the first voltage with a reference voltage; and
    activating a voltage clamping device to protect the transistor when the first voltage exceeds the reference voltage.

16. The method of claim 15, further including deactivating the voltage clamping device when the first voltage drops below the reference voltage.

17. The method of claim 15, wherein the activating is performed via a driver switch that is connected across terminals of the voltage clamping device.

18. The method of claim 15, wherein the monitoring is performed through a sense diode that is fabricated with the transistor on a same substrate.

* * * * *